(12) United States Patent
Hautson et al.

(10) Patent No.: US 10,310,030 B2
(45) Date of Patent: Jun. 4, 2019

(54) METHOD FOR AUTOMATICALLY RECOGNISING A MAGNETIC OBJECT

(71) Applicant: Commissariat à l'énergie atomique et aux énergies alternatives, Paris (FR)

(72) Inventors: Tristan Hautson, Fontaine (FR); Rabeb Aloui, Fontaine (FR); Saifeddine Aloui, Grenoble (FR); Timothée Jobert, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 165 days.

(21) Appl. No.: 14/773,509

(22) PCT Filed: Feb. 26, 2014

(86) PCT No.: PCT/EP2014/053773
§ 371 (c)(1),
(2) Date: Sep. 8, 2015

(87) PCT Pub. No.: WO2014/135421
PCT Pub. Date: Sep. 12, 2014

(65) Prior Publication Data
US 2016/0018485 A1    Jan. 21, 2016

(30) Foreign Application Priority Data

Mar. 8, 2013   (FR) ..................... 13 52129

(51) Int. Cl.
*G01R 33/12* (2006.01)
*G01R 33/00* (2006.01)
(Continued)

(52) U.S. Cl.
CPC ......... *G01R 33/12* (2013.01); *G01R 33/0094* (2013.01); *G01R 33/0206* (2013.01); *G01R 33/10* (2013.01); *G01V 3/081* (2013.01)

(58) Field of Classification Search
CPC ........................... G01R 33/12; G01R 33/0206
(Continued)

(56) References Cited

U.S. PATENT DOCUMENTS 5,731,996 A * 3/1998 Gilbert ................. G01V 3/081
                                                    324/207.13
6,841,994 B1 * 1/2005 Wiegert ................. G01V 3/15
                                                    324/244
(Continued)

FOREIGN PATENT DOCUMENTS

FR         2952450       5/2011

*Primary Examiner* — Christine A Enad
(74) *Attorney, Agent, or Firm* — Occhiuti & Rohlicek LLP

(57) ABSTRACT

A method for recognizing a magnetic object includes holding the object immobile in front of an array of N (where N is >five) tri-axial magnetometers ($M_{ij}$) linked with no degree of freedom. There is a fixed distance between two consecutive magnetometers less than the maximum separation between the magnetic parts of the magnetic object furthest away from one another. The method includes measuring by each magnetometer a vector $b_{i,m}$ of which each coordinate represents the value of the magnetic field projected onto a respective measurement axis of the magnetometer, and a union of vectors $b_{i,m}$ forming a measured magnetic signature $S_m$, where the index "i" is an identifier of the magnetometer. The method includes computing of a deviation E between the magnetic signature $S_m$ and a prerecorded magnetic signature $S_{Ref}$ of a known magnetic object. The method includes comparing E to a predetermined threshold and recognizing the magnetic object.

18 Claims, 2 Drawing Sheets

(51) Int. Cl.
*G01R 33/02* (2006.01)
*G01R 33/10* (2006.01)
*G01V 3/08* (2006.01)

(58) Field of Classification Search
USPC .......................................................... 702/57
See application file for complete search history.

(56) References Cited

U.S. PATENT DOCUMENTS

| | | | | |
|---|---|---|---|---|
| 7,319,321 B2 * | 1/2008 | Murray | ................. | G01V 3/081 |
| | | | | 324/243 |
| 7,603,251 B1 * | 10/2009 | Wiegert | ................. | G01V 3/081 |
| | | | | 702/152 |
| 7,932,718 B1 * | 4/2011 | Wiegert | ............... | G01R 33/022 |
| | | | | 324/245 |
| 2014/0074429 A1 * | 3/2014 | Chow | ................ | G01R 33/0035 |
| | | | | 702/154 |

* cited by examiner and FR2952450A1.

METHOD FOR AUTOMATICALLY RECOGNISING A MAGNETIC OBJECT

RELATED APPLICATIONS

This application is a U.S. National Stage of international application number PCT/EP2014/0753776, filed Feb. 26, 2014, which claims the benefit of the priority date of French Patent Application FR 1352129, filed Mar. 8, 2013, the contents of which are herein incorporated by reference.

FIELD OF INVENTION

The invention relates to a method and an apparatus for automatically recognizing a magnetic object. The invention relates also to an information storage medium for implementing this method.

BACKGROUND

Here, "magnetic object" denotes an object comprising one or more magnetic parts made of a magnetic material. A same magnetic part is generally a single block of magnetic material. A magnetic material is a material which exhibits magnetic properties that can be measured by an apparatus for automatically recognizing magnetic objects.

There are many situations in which it is desirable to be able to automatically recognize an object. For example, this may be useful for modifying the operation of a machine, such as a robot, or for automatically triggering an action according to the recognized object. Moreover, many objects already include magnetic parts. It is also very easy to add a magnetic part, such as, for example, a permanent magnet, to any object.

Prior art is known from U.S. Pat. No. 6,841,994B1 and FR2952450A1.

SUMMARY OF INVENTION

The subject of the invention is therefore a method for automatically recognizing a magnetic object according to claim 1.

The use of an array of magnetometers separated from one another by a distance less than the maximum separation between the magnetic parts of the magnetic object furthest apart makes it possible to measure a very accurate magnetic signature of this object. This method is then particularly effective for recognizing the magnetic object because it makes it possible to distinguish magnetic objects which resemble one another. For example, experimental results show that this method makes it possible to recognize and distinguish an iPhone5® telephone from an iPhone4 ® telephone without any modification being made to these cell phones.

The embodiments of this method can include one or more of the features of the dependent claims.

These embodiments of the method also offer the following advantages:
- the holding of the magnetic object at a distance less than the distance $d_{max}$ defined above and, preferably less than 50 cm, makes it possible to very significantly improve the recognition of the magnetic object;
- the rotation or the translation of the signature $S_m$ or $S_{Ref}$ to find the minimum value of the deviation E makes it possible to make the recognition method more robust with respect to errors of positioning of the magnetic object to be recognized relative to the predetermined position in which the signature of the known object was recorded;
- using an array of magnetometers in which the fixed distance between two immediately consecutive magnetometers is less than the maximum separation between the two magnetic parts furthest away from one another of the magnetic object makes it possible to further improve the accuracy of the measurement in the step c) and therefore the recognition of the magnetic object;
- using an array of magnetometers in which the magnetometers are distributed along at least two non-parallel directions makes it possible to improve the recognition of the magnetic objects.

Another subject of the invention is an information storage medium according to claim 8.

Another subject of the invention is an apparatus for recognizing a magnetic object according to claim 9.

The invention will be better understood on reading the following description, given purely as a nonlimiting example and with reference to the drawings.

BRIEF DESCRIPTION OF THE DRAWINGS

In these figures, the same references are used to denote the same elements.

DETAILED DESCRIPTION

Hereinafter in this description, the features and the functions well known to those skilled in the art are not described in detail.

Figure 1:
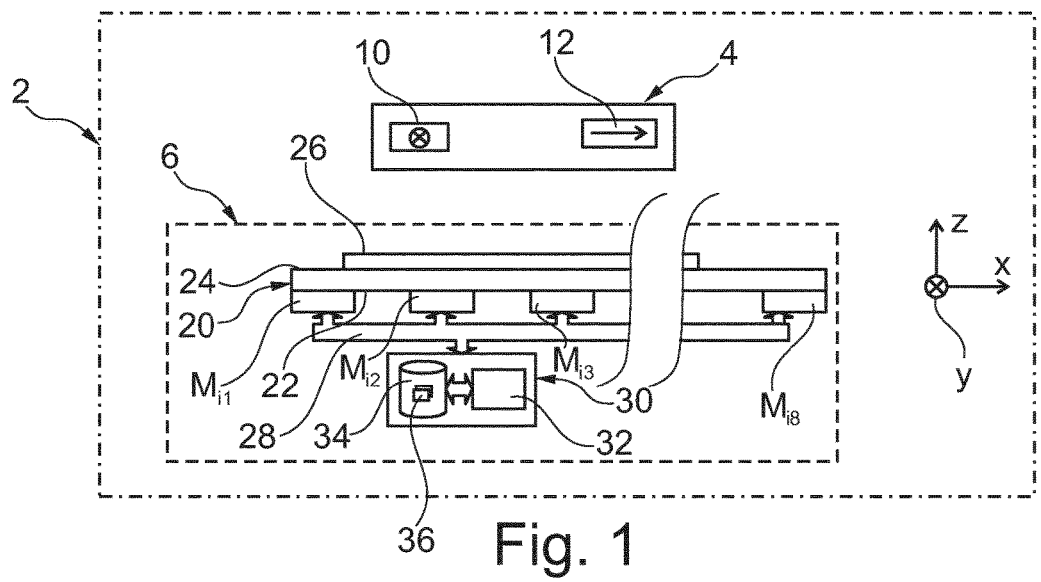
FIG. 1 is a schematic illustration of an identification system comprising an object to be recognized and an apparatus for automatically recognizing magnetic objects.

FIG. 1 represents an identification system 2. The system 2 comprises a magnetic object 4 to be recognized and an apparatus 6 for automatically recognizing magnetic objects.

Typically, the object 4 can be moved directly by the hand of a human being. To this end, the object 4 generally weighs less than 10 kg and, preferably, less than 1 kg or 250 g. For example, the dimensions of the object 4 are small enough for it to be able to be grasped and moved by a single hand of a user.

The object 4 comprises at least one magnetic part, that is to say made of a magnetic material. This magnetic part is capable of distorting the field lines of the Earth's magnetic field. Here, the magnetic material has a static relative permeability pr different from one. Preferably, it is a ferromagnetic or ferrimagnetic material.

A magnetic object can comprise a single magnetic part or, on the contrary, a plurality of distinct magnetic parts secured to one another. The different magnetic parts can be mechanically fixed to one another with no degree of freedom or, on the contrary, with one or more degrees of freedom. Each of these magnetic parts can acquire a magnetization, and therefore exhibit a non-zero magnetic moment, only in the presence of an external magnetic field such as the Earth's magnetic field or, on the contrary, exhibit a permanent magnetization. A permanently magnetized magnetic part is also called a permanent magnet. A permanent magnet exhibits a non-zero magnetic moment even in the absence of external magnetic field. Typically, the permanent magnet is made from a magnetic material with a coercive magnetic field greater than 100 A·m$^{-1}$ or 500 A·m$^{-1}$. The strength of this permanent magnet can be greater than 0.01 A·m$^2$ or 0.1 A·m$^2$. When the magnetic object comprises a plurality of permanent magnets, it is also preferable for the ratio between the strengths of these permanent magnets to be less than 10 or 5 and, advantageously, less than 2 or 1.5 or equal to 1.

Here, the object 4 essentially comprises two magnetic parts 10 and 12 that are immobile relative to one another. For example, they are fixed with no degree of freedom to one and the same frame of the object 4. Here, the frame is made of a non-magnetic material. A non-magnetic material does not exhibit any magnetic property that can be measured by the apparatus 6.

Given that the magnetic parts 10 and 12 are fixed in the object 4, the relative distances between the magnetic dipoles corresponding to the parts 10 and 12 and the angles between these magnetic moments are constant. Similarly, in this embodiment, the number of magnetic parts in the object 4 and the magnetic moments of these parts are assumed constant.

Here, the object 4 is a cell phone. In the case of a cell phone, the two magnetic parts 10 and 12 are formed, respectively, by the microphone and the loudspeaker of the telephone. In effect, these parts include permanent magnets.

The apparatus 6 makes it possible to measure the Earth's magnetic field distorted by the presence of the object 4. To this end, the apparatus 6 includes an array of N tri-axial magnetometers $M_{ij}$. In FIG. 1, the vertical wavy lines indicate that a part of the apparatus 6 has not been represented.

Typically, N is greater than 5 and, preferably, greater than 16 or 32. Here, N is greater than or equal to 64.

In this embodiment, the magnetometers $M_{ij}$ are aligned in rows and in columns to form a matrix. Here, this matrix comprises eight rows and eight columns. The indices i and j respectively identify the row and the column of this matrix at the intersection of which the magnetometer $M_{ij}$ is located. In FIG. 1, only the magnetometers $M_{i1}$, $M_{i2}$, $M_{i3}$, $M_{i4}$ and $M_{i8}$ of a row i are visible. The position of the magnetometers $M_{ij}$ relative to one another is described in more detail with reference to FIG. 2.

Each magnetometer $M_{ij}$ is fixed with no degree of freedom to the other magnetometers. To this end, the magnetometers $M_{ij}$ are fixed with no degree of freedom onto a rear face 22 of a horizontal rigid plate 20. This rigid plate has a front face 24 turned toward the object 4. The plate 20 is made from a rigid non-magnetic material. For example, the plate 20 is made of glass.

Preferably, the plate 20 also comprises, on its front face, a device 26 for assisting in the placement of the object 4. This device 26 helps the user to position and hold the object 4 in a predetermined position relative to the magnetometers $M_{ij}$. The device 26 is, for example, a template of the object. This template includes a drawing on the face 24 of the outline of the object 4 or a hollowed-out imprint of the object 4.

Each magnetometer $M_{ij}$ measures the direction and the amplitude of the magnetic field generated or disturbed by the object 4. For that, each magnetometer $M_{ij}$ measures the norm of the orthogonal projection of the magnetic field at this magnetometer $M_{ij}$ on three measurement axes of this magnetometer. Here, these three measurement axes are mutually orthogonal. For example, the measurement axes of each of the magnetometers $M_{ij}$ are, respectively, parallel to the directions X, Y and Z of an orthogonal reference frame XYZ. The reference frame XYZ is fixed with no degree of freedom to the apparatus 6. Here, the directions X and Y are horizontal and the direction Z is vertical. Here, $b_{ij}$ denotes the vector whose coordinates are formed by the measurements $x_{ij}$, $y_{ij}$ and $z_{ij}$, where $x_{ij}$, $y_{ij}$ and $z_{ij}$ are the measurements of the magnetometer $M_{ij}$ on its measurement axes parallel, respectively, to the directions X, Y and Z.

The sensitivity of the magnetometer $M_{ij}$ is for example equal to or less than $4*10^{-7}$ T.

Each magnetometer $M_{ij}$ is connected via an information transmission bus 28 to a processing unit 30.

Figure 3:
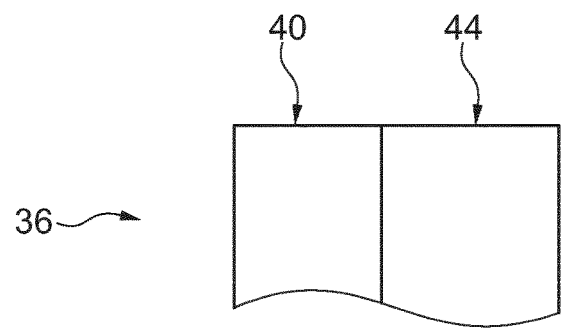
FIG. 3 is a schematic illustration of a database used in the recognition apparatus of the system of FIG. 1.
Figure 4:
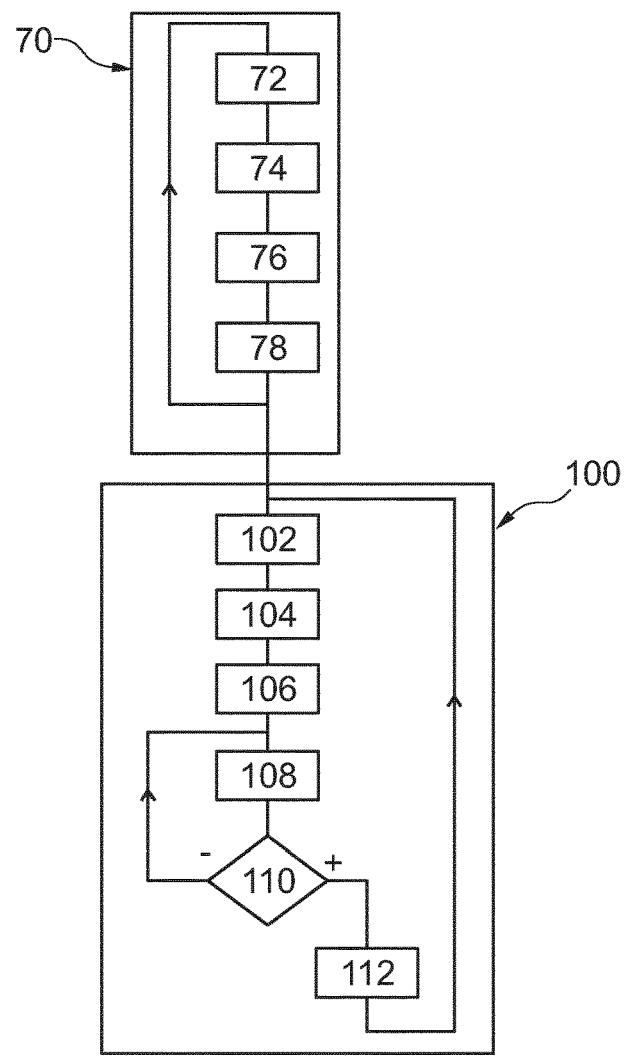
FIG. 4 is a flow diagram of a method for automatically recognizing a magnetic object using the system of FIG. 1.

The processing unit 30 is suitable for implementing the method of FIG. 4. In particular, from the measurements of the magnetometers $M_{ij}$, the unit 30 is capable of recognizing the magnetic object presented in front of the apparatus 6 by comparison to a database 36 of magnetic signatures of known objects. This database 36 is described in more detail with reference to FIG. 3. To this end, the unit 30 comprises a programmable electronic computer 32 suitable for executing instructions stored on an information storage medium. The unit 30 therefore also comprises a memory 34 containing the instructions necessary for the execution by the computer 32 of the method of FIG. 4. The database 36 is stored in the memory 34.

Figure 2:
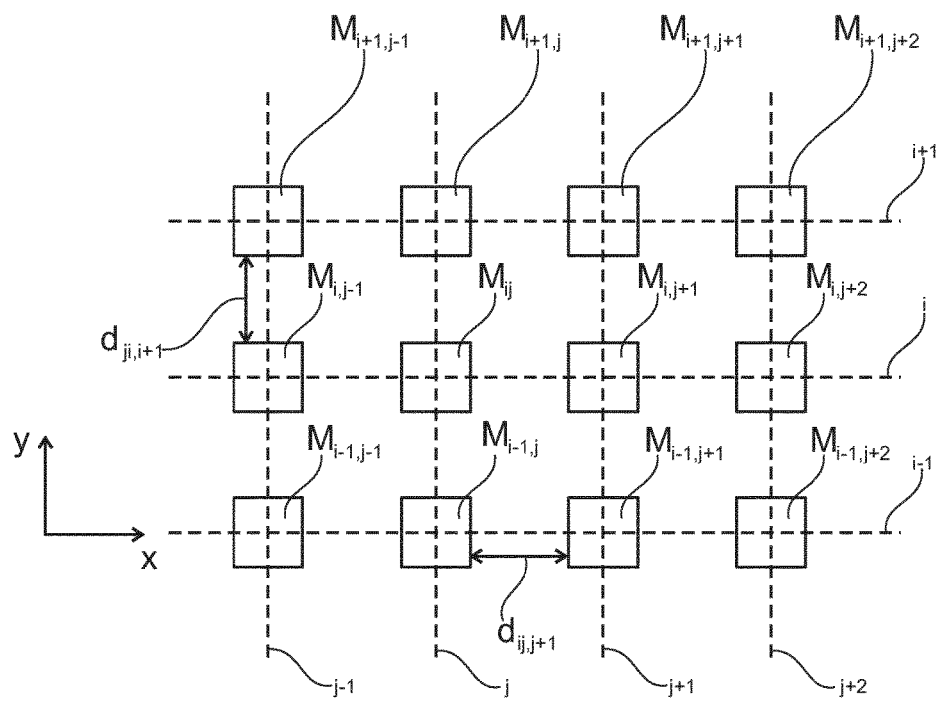
FIG. 2 is a schematic and partial illustration of an array of magnetometers used in the recognition apparatus of the system of FIG. 1.

FIG. 2 represents some of the magnetometers $M_{ij}$ of the apparatus 6. These magnetometers $M_{ij}$ are aligned in rows i parallel to the direction X. These magnetometers are also aligned in columns j parallel to the direction Y to form a matrix. The rows i and the columns j are arranged in ascending index order.

The surface area occupied by the array of magnetometers is typically less than 100 m$^2$ and, preferably, less than 5 m$^2$ or 1 m$^2$ or 50 cm$^2$.

The center of the magnetometer $M_{ij}$ is located at the intersection of the row i and of the column j. The center of the magnetometer corresponds to the point where the magnetic field is measured by this magnetometer. Here, the indices i and j belong to the range [1; 8].

The centers of two immediately consecutive magnetometers $M_{ij}$ and $M_{i,j+1}$ along a row i are separated by a known distance $d_{i,j,j+1}$. Similarly, the center of two immediately consecutive magnetometers $M_{ij}$ and $M_{i+1,j}$ along a same column j are separated by a known distance $d_{j,i,i+1}$.

In the particular case described here, whatever the row i, the distance $d_{i,j,j+1}$ is the same. This distance is therefore denoted $d_j$. Similarly, whatever the column j, the distance $d_{j,i,i+1}$ between two magnetometers is the same. This distance is therefore denoted $d_i$.

Here, the distances $d_i$ and $d_j$ are both equal to d.

The distance d is less than, and preferably at least two times smaller than, the maximum separation between the magnetic parts of the magnetic object to be recognized furthest away from one another. Here, this distance d is therefore less than the shortest distance which separates the parts 10 and 12.

Typically, the distance d is between 1 and 4 cm when:
the strength of each permanent magnet likely to be contained in the object to be recognized is less than 2 A·m$^2$ or 1 A·m$^2$ or 0.5 A·m$^2$ and, preferably, greater than 0.1 A·m$^2$ or 0.2 A·m$^2$,
the sensitivity of the magnetometers is $4*10^{-7}$ T, and
the number of magnetometers $M_{ij}$ is sixty four.

FIG. 3 represents in more detail the database 36. This database 36 contains the magnetic signatures of several known magnetic objects. Here, it is represented in the form of a table.

For each known object, the database 36 includes, in a column 40, an identifier "Ref" of this known object. The identifier "Ref" uniquely identifies this known object out of all the known objects stored in the database 36. Each identifier "Ref" is associated by the base 36 with a prestored magnetic signature $S_{Ref}$ of this known object. The signature $S_{Ref}$ is contained in the column 44.

The magnetic signature of an object comprises distinctive characteristics making it possible to identify this object out of all the known objects indexed in the database 36. Here, it comprises the union of the vectors $b_{ij}$ measured at the same time by each of the magnetometers $M_{ij}$. A magnetic signature of an object is therefore the set of the vectors: $\{b_{11}, b_{12}, \ldots, b_{ij}, b_{i,j+1}, \ldots b_{i+1,j}, b_{i+1,j+1}, \ldots, b_{N,N}\}$. Hereinbelow, to distinguish the vectors and the measurements contained in the signature of a known object "Ref" from those contained in the signature of an object to be recognized, the identifier "ij" of the magnetometer $M_{ij}$ is followed by the index "Ref" in the case of the vectors and measurements contained in the signature $S_{Ref}$. Conversely, the identifier "ij" of the magnetometer $M_{ij}$ is followed by the index "m" in the case of the vectors and measurements contained in the signature $S_m$ of the object to be recognized. Thus, with these notations, the vector $b_{ij,Ref}$ and the measurements $x_{ij,ref}$ designate, respectively, the vector $b_{ij}$ and the measurement $x_{ij}$ obtained from the magnetometer $M_{ij}$ and contained in the signature $S_{Ref}$. The vector $b_{ij,m}$ and the measurement $x_{ij,m}$ designate, respectively, the vector $b_{ij}$ and the measurement $x_{ij}$ obtained from the magnetometer $M_{ij}$ and contained in the signature $S_m$.

The operation of the system 2 will now be described with reference to the method of FIG. 4.

This method begins with a phase 70 of storing magnetic signatures $S_{Ref}$ of several known magnetic objects in the database 36 and associating a known object identifier with each of these signatures.

For that, for example, in a step 72, the known object is placed in front of the face 24 in a predetermined position and it is held immobile in this position throughout the next step. The predetermined position is chosen in such a way that, in that position, the shortest distance between at least four of the magnetometers $M_{ij}$ and the known object is less than $d_{max}$. $d_{max}$ is equal to $[\mu_0 m / 4\pi\sigma 10^{(SNR/20)}]^{1/3}$, where:

σ is the standard deviation of the noise of the magnetometers,
$\mu_0$ is the permeability of the vacuum,
m is the magnetic moment of the magnetic object, and
SNR is a constant equal to 6.02 db.

Typically, for the objects that are to be recognized, $d_{max}$ is equal to or smaller than 50 cm or 30 cm.

To this end, the known object is placed in the template of the device 26. For example, it is held immobile in this template simply by the force of gravity.

Then, in a step 74, the magnetometers $M_{ij}$ simultaneously measure the magnetic field in the presence of the known object. Preferably, the step 74 is reiterated several times, for example more than 10 or 50 times, to obtain several measurements for each magnetometer $M_{ij}$. Then, it is the average of these measurements for each magnetometer $M_{ij}$ which is processed in the subsequent steps. That makes it possible to filter some of the noise of the measurements. The step 74 typically lasts less than a second.

In a step 76, the unit 30 constructs the magnetic signature $S_{Ref}$ of the known object from the measurements carried out in the step 74. This signature $S_{Ref}$ notably comprises the union of the vectors $b_{ij,Ref}$ measured in the step 74 by all the magnetometers $M_{ij}$.

In a step 78, the signature $S_{Ref}$ is stored in the database 36 associated with the identifier "Ref" of the known object.

The steps 72 to 78 are then reiterated for a large number of known objects different to one another in order to populate the database 36. The steps 72 to 78 can also be reiterated for the same known object but placed in a different position with respect to the magnetometers $M_{ij}$. In effect, the presence of the device 26 limits the number of possible positions of the object relative to the magnetometers $M_{ij}$ but does not necessarily prohibit several predetermined positions for the same object. For example, in the case of a cell phone, the latter can be positioned inside the template with its screen turned toward the face 24 or turned away from the face 24. It can also be positioned in the template with its microphone situated on the left or on the right. Thus, the template allows four predetermined positions for a cell phone. However, it is not always necessary to store a signature $S_{Ref}$ for each possible predetermined position of the known object. In effect, as explained below, it is possible to recognize an object even if the latter is not placed exactly in the same predetermined position as that used to record the signature $S_{Ref}$.

By way of example, the signatures of the following objects are stored in the database 36 in the phase 70:
the object 4,
a cell phone of a brand other than that of the object 4,
a stapler,
a screwdriver,
a pen fitted with at least one permanent magnet,
a brush fitted with a permanent magnet of a strength greater than that of the magnet of the pen,
a bulb, and
a laptop computer.

Once the database 36 has been populated with several magnetic signatures of known objects, a phase 100 of automatic recognition of an unknown object can then be carried out. The unknown object is chosen from the objects whose signatures were stored in the phase 70. Subsequently, it is assumed that this unknown object is the object 4.

The phase 100 begins with three steps 102 to 106 that are identical, respectively, to the steps 72 to 76, except that it is the unknown object which is placed in front of the face 24. At the end of the step 106, it is therefore the signature $S_m$ of the object 4 which is obtained.

In a step 108, the unit 30 computes a deviation E between the signature $S_m$ and a signature $S_{Ref}$ prestored in the database 36. The deviation E is representative of the resemblance between the signatures $S_m$ and $S_{Ref}$. Here, the greater this resemblance, the smaller the deviation E.

In this embodiment, the following steps are based on the analogy which exists between a magnetic signature constructed by the unit 30 and a matrix image. To this end, each magnetic signature is stored in a file in the format of a matrix image. For example, the format used is the format known by the term "bitmap". For that, each magnetometer $M_{ij}$ is likened to a sensor making it possible to measure the equivalent of a "color", the "color" here being the measurements $x_{ij}$, $y_{ij}$ and $z_{ij}$ of the magnetometer $M_{ij}$. More specifically:

the indices ij which identify the position of the magnetometer $M_{ij}$ in the reference frame X, Y, Z correspond to the position of the pixel in the image, and the measurements $x_{ij}$, $y_{ij}$ and $z_{ij}$ of the magnetometer $M_{ij}$ code the color of the pixel for example, in an RGB (red green blue) coding.

Here, each pair of indices "ij" is associated with the coordinates $a_{ij}$, $b_{ij}$ and $c_{ij}$ of the magnetometer $M_{ij}$ in the reference frame XYZ.

Subsequently, each file containing a magnetic signature in a matrix image format is called "magnetic image". The file containing the signatures $S_m$ or $S_{Ref}$ are designated, respectively, by images $I_m$ and $I_{Ref}$. In these files, each pixel $P_{ij}$ corresponds to a respective magnetometer $M_{ij}$. From the moment when the signatures $S_m$ and $S_{Ref}$ are stored in the format of a matrix image, it is possible to use the same known algorithms as those used in image processing to compute the correlation between the files $I_m$ and $I_{Ref}$ and therefore between the signatures $S_m$ and $S_{Ref}$, and also the minimum deviation E between these signatures. These algorithms are not therefore described here in detail.

For example, the unit 30 applies a transformation to the image $I_m$ to obtain a transformed image $I_t$ which minimizes the value of the deviation E. Typically, this transformation is a composition of translations and of rotations. For example, the translations applied to the pixels of the image $I_m$ are translations parallel to the plane XY. The rotations applied to the pixels of the image $I_m$ are rotations about an axis parallel to the direction Z or rotations of 180° relative to an axis belonging to the plane XY.

The deviation E is for example computed using one of the following formulae:

$$E = \sum_{k=1}^{N} \sqrt{(x_{k,m} - x_{k,Ref})^2 + (y_{k,m} - y_{k,Ref})^2 + (z_{k,m} - z_{k,Ref})^2} \quad (1)$$

$$E = \sqrt{\sum_{k=1}^{N} (x_{k,m} - x_{k,Ref})^2 + (y_{k,m} - y_{k,Ref})^2 + (z_{k,m} - z_{k,Ref})^2} \quad (2)$$

$$E = \sum_{k=1}^{N} (|x_{k,m} - x_{k,Ref}| + |y_{k,m} - y_{k,Ref}| + |z_{k,m} - z_{k,Ref}|) \quad (3)$$

At the end of the step 108, the value of the deviation E is the value obtained with the transformation of the image $I_m$ which minimizes this deviation. The use of an algorithm which makes it possible to find the transformation which best correlates the signatures $S_m$ and $S_{Ref}$ makes the recognition method robust with respect to errors of positioning of the object 4 relative to the predetermined position in which the signature $S_{Ref}$ was stored.

Then, in a step 110, the deviation E is compared to a predetermined threshold $L_1$. If the deviation E is greater than the threshold $L_1$, the steps 108 and 110 are reiterated with a new signature $S_{Ref}$. If, however, the steps 108 and 110 have already been executed for all the signatures $S_{ref}$ contained in the database 36, without the object 4 having been able to be recognized, then the procedure is stopped, and the unit 30 indicates that the object 4 has not been recognized.

If the error E is less than the threshold $L_1$, the object 4 corresponds to the known object "Ref". In response, in a step 112, the unit 30 communicates this information to a software module responsible for executing a specific operation in response to the recognition of the object 4. For example, this software module communicates the identifier "Ref" of the recognized object to a human being via a human-machine interface. This software module may also automatically trigger an action in response to the recognition of this object such as, for example, the control of an external electronic peripheral device.

Many other embodiments are possible. For example, the magnetic parts of the object to be recognized may participate in the operation of this object. Such is, for example, the case when the magnetic parts are the permanent magnets of the loudspeaker and of the microphone of a cell phone. However, the magnetic parts can also be added to the object to be recognized in order to allow it to be recognized by the apparatus 6. For example, different permanent magnets are added to utensils normally without any magnetic part, such as a pencil and an eraser. The apparatus 6 can then recognize them.

The magnetometers can have more than three measurement axes. However, even when a magnetometer has more than three measurement axes, this magnetometer is here also qualified as "tri-axial" magnetometer because it comprises at least three non-collinear measurement axes.

The distance between the magnetometers does not need to be known. It is sufficient for it to be constant for the recognition of the magnetic object to be able to be implemented.

The magnetometers $M_{ij}$ are not necessarily arranged in a same plane. As a variant, the magnetometers are arranged in a three-dimensional space. In this space, the position of each magnetometer is identified by the coordinates $a_{ij}$, $b_{ij}$ previously defined and, in addition, by a coordinate cu along the direction Z of the reference frame X, Y, Z. In this variant, the value of the coordinate $c_{ij}$ is not the same for all the magnetometers. Conversely, in an extremely simplified case, all of the magnetometers of the array are aligned along a same rectilinear axis.

As a variant, the device 26 for assisting in the positioning of the magnetic object to be recognized is omitted. Conversely, in another embodiment, this device 26 can be replaced by a more efficient assisting device, for example including mechanical polarizers which allow the object to be recognized to be positioned only in one of the predetermined positions where a magnetic signature $S_{Ref}$ of the same object has already been prestored in the database 36.

The storage phase 70 can be carried out differently. For example, the signatures $S_{Ref}$ are constructed from measurements supplied by an apparatus other than the apparatus 6. In this case, this other apparatus includes the same matrix of magnetometers $M_{ij}$.

As a variant, the magnetic signature of an object comprises only the vectors $b_{ij}$ whose amplitude exceeds a predetermined threshold, for example, several times greater than the level of the ambient noise.

The magnetic signature of an object can change according to its state of use. For example. The amplitude of one of the magnetic moments of the object may vary over time between a state in which the object 4 is powered or switched on and a state in which the object 4 is off or not powered. In this case, one solution is to store in the database 36 a first magnetic signature of the object when it is on and a second signature when it is off. Thus, in addition to recognizing the object, this also makes it possible to indicate whether it is off or on.

The measurements of the magnetometers can be stored in a first stage. Then, the steps 76, 78 or 104 to 112 are carried out later at a time when the magnetic object is no longer present in front of the face 24 of the array of magnetometers. Similarly, the execution of the method of FIG. 4 can be distributed over several electronic computers. For example, the steps 108 to 112 are executed by a programmable electronic computer distinct from the computer which executes only the steps 102 to 106. The processing unit 30 then comprises all of these computers.

The step 108 can be carried out differently. For example the image $I_{Ref}$ is transformed and not the image $I_m$.

The step 108 can be simplified if the magnetic object to be recognized is always placed in one of the predetermined positions where a signature $S_{Ref}$ has been stored in the database 36. In this case, it is possible to proceed directly with the computation of the value of the deviation E using one of the relationships (1), (2), or (3) without trying to best fit the image $I_m$ to the image $I_{Ref}$.

As a variant, a filtering of recognition results can be added. For that, the phase 100 is reiterated several times for the same object to be recognized. In the step 112, the object is considered to be recognized only if the same object has been recognized at the end of more than 50% or 80% of the iterations of the phase 100.

The value of the threshold $L_1$ can be a constant independent of the results of the preceding steps, or, on the contrary, be predetermined as a function of the preceding iterations of the steps 108 and 110. For example, the value of the threshold $L_1$ is replaced by the value of the deviation E each time the value of this deviation is smaller than that of the threshold $L_1$. In this case, the object which is recognized systematically corresponds to that for which the value of the deviation E is minimum.

The invention claimed is:

1. A non-abstract method comprising implementing an improvement in technology, wherein said technology is the technology of magnetometers, wherein said improvement comprises a method of using an array of magnetometers to recognize a relationship between a first object and a second object, said first and second objects each being secured to a corresponding one of a plurality of parts—wherein each of said parts is capable of distorting the field lines of the Earth's magnetic field, wherein said plurality of parts comprises a first part and a second part, wherein said array comprises at least five tri-axial magnetometers, wherein said at least five tri-axial magnetometers comprise consecutive tri-axial magnetometers that are separated by a fixed distance, wherein implementing said improvement comprises executing a process that includes holding said first object at a predetermined position against said array and computing a deviation between a measurement and a reference, wherein said measurement is a measurement of at least fifteen norms along said array of magnetometers, wherein said norms are measured while said first object is thus held against said array, wherein said reference is a reference based on at least fifteen corresponding norms that would have been obtained by said array had said second object been held against said array at said predetermined position, wherein each of said norms is a norm of a projection of a magnetic field along an axis of one of said tri-axial magnetometers, wherein said process further comprises determining a relationship between said deviation and a predetermined threshold, and based on said relationship, selecting an action from the group consisting of recognizing that said first object corresponds to said second object and recognizing that said first object does not correspond to said second object, wherein said plurality of parts comprises a third part that is fixed to said first object, wherein a separation between said first and third parts is a maximum separation between any two parts on said first object, wherein said maximum separation is twice said fixed distance between said magnetometers.

2. The method of claim 1, wherein, for at least four magnetometers of the array of magnetometers, the shortest distance between the magnetometers and the magnetic object is less than $d_{max}$, $d_{max}$ being equal to $[\mu_0 m/4\pi\sigma 10^{(SNR/20)}]^{1/3}$, where: $\sigma$ is the standard deviation of the noise of the magnetometer, $\mu_0$ is the permeability of the vacuum, m is the magnetic moment of the magnetic object, and SNR is a constant equal to 6.02 db.

3. The method of claim 1, wherein, for at least four magnetometers of the array of magnetometers, the shortest distance between the magnetometers and the magnetic object is less than 50 cm.

4. The method of claim 1, wherein holding said first object at a predetermined position against said array comprises holding the magnetic object in a predetermined position in front of the array of magnetometers in which the fixed distance between two immediately consecutive magnetometers is at least half the maximum separation between two magnetic parts of the magnetic object furthest away from one another.

5. The method of claim 1, wherein the array of magnetometers comprises magnetometers distributed along at least two non-parallel directions.

6. The method of claim 1, wherein selecting an action comprises recognizing that said first object does not correspond to said second object.

7. The method of claim 1, wherein selecting an action comprises recognizing that said first object corresponds to said second object.

8. The method of claim 1, wherein said plurality of parts comprises a third part, said method further comprising selecting said first object to be a frame of a cell phone, selecting said first part to be a microphone secured to said frame, and selecting said third part to be a speaker secured to said frame.

9. The method of claim 1, wherein holding said first object at a predetermined position against said array comprises placing said first object within an outline of said first object.

10. The method of claim 1, wherein holding said first object at a predetermined position against said array comprises placing said first object within a recess shaped like said first object.

11. The method of claim 1, wherein there exists a first dipole moment associated with said first object, wherein said magnetometers are characterized by a noise level having a variance, wherein there exists a cube that has a volume that is proportional to a ratio of said dipole moment to said variance, wherein, while said first object is held, there exists a plurality of distances, each of which is a distance between a magnetometer and said first object, wherein holding said first object comprises causing said first object to be a location such that at least four distances from said plurality of distances is less than a maximum distance, and wherein said maximum distance is selected based on a length of an edge of said cube.

12. The method of claim 11, further comprising increasing said distance in response to an increase in said dipole moment.

13. The method of claim 11, further comprising decreasing said distance in response to an increase in said variance.

14. The method of claim 1, wherein computing a deviation comprises causing one of a translation or rotation of at least one of said measurement and said reference so as to minimize said deviation.

15. The method of claim 1, wherein said first object comprises a permanent magnet.

16. A non-abstract apparatus for implementing an improvement in the technology of recognizing a relationship between first and second objects, said first and second objects each being secured to a corresponding one of a plurality of parts, wherein each of said parts is capable of distorting the field lines of the Earth's magnetic field, wherein said plurality of parts comprises a first part, a second part, and a third part, wherein said third part is fixed to said first object, said apparatus comprising an array of non-abstract magnetometers, said array comprising at least five tri-axial non-abstract magnetometers that are linked mechanically to one another with no degree of freedom to maintain a fixed distance between each of the magnetometers, wherein a separation between said first and third parts is a maximum separation between any two parts on said first object, wherein said maximum separation is twice said fixed distance between each of the magnetometers, and a processing unit programmed to compute a deviation between a measurement and a reference when said first object is held at a predetermined first position against said array, wherein said measurement is a measurement of at least fifteen norms along said array of magnetometers, wherein said norms are measured while said first object is thus held against said array, wherein said reference is a reference based on at least fifteen corresponding norms that would have been obtained by said array had said second object been held against said array at said predetermined position, wherein each of said norms is a norm of a projection of a magnetic field along an axis of one of said tri-axial magnetometers, wherein said processor is further configured to determine a relationship between said deviation and a predetermined threshold, and based on said relationship, to select an action from the group consisting of recognizing that said first object corresponds to said second object and recognizing that said first object does not correspond to said second object.

17. The apparatus of claim 16, further comprising a device for holding the first object in a predetermined position, the device being at least suitable for indicating, to a human being, the predetermined position in which the first object, which is to be recognized, must be placed.

18. A manufacture comprising a tangible and non-transitory information storage medium comprising instructions for causing an electronic computer to compute a deviation, wherein said electronic computer is a constituent of an apparatus for recognizing a relationship between first and second objects, said first and second objects each being secured to a corresponding one of a plurality of parts, wherein each of said parts is capable of distorting the field lines of the Earth's magnetic field, wherein said plurality of parts comprises a first part, a second part, and a third part, wherein said third part is fixed to said first object, wherein said apparatus comprises, in addition to said electronic computer, an array of non-abstract magnetometers, said array comprising at least five tri-axial non-abstract magnetometers that are linked mechanically to one another with no degree of freedom to maintain a fixed distance between each of the magnetometers, wherein a separation between said first and third parts is a maximum separation between any two parts on said first object, wherein said maximum separation is twice said fixed distance between each of the magnetometers, and wherein said instructions, when executed by said electronic computer, cause said electronic computer to compute said deviation between a measurement and a reference when said first object is held at a predetermined first position against said array, wherein said measurement is a measurement of at least fifteen norms along said array of magnetometers, wherein said norms are measured while said first object is thus held against said array, wherein said reference is a reference based on at least fifteen corresponding norms that would have been obtained by said array had said second object been held against said array at said predetermined position, wherein each of said norms is a norm of a projection of a magnetic field along an axis of one of said tri-axial magnetometers, wherein said instructions further comprise instructions for causing said electronic computer to determine a relationship between said deviation and a predetermined threshold and based on said relationship, to select an action from the group consisting of recognizing that said first object corresponds to said second object and recognizing that said first object does not correspond to said second object.

* * * * *